United States Patent [19]

Shimamoto et al.

[11] Patent Number: 5,780,143
[45] Date of Patent: Jul. 14, 1998

[54] CIRCUIT BOARD

[75] Inventors: Toshitsugu Shimamoto; Toshihiro Katayama, both of Tokuyama, Japan

[73] Assignee: Tokuyama Corporation, Yamaguchi-Ken, Japan

[21] Appl. No.: 605,474

[22] Filed: Feb. 26, 1996

[30] Foreign Application Priority Data

Mar. 1, 1995 [JP] Japan .................. 7-042153

[51] Int. Cl.$^6$ ........................ B32B 9/00
[52] U.S. Cl. ............. 428/209; 428/901; 428/615; 174/257; 174/261
[58] Field of Search ............... 428/209, 901; 174/257, 261

[56] References Cited

U.S. PATENT DOCUMENTS

| | | | |
|---|---|---|---|
| 3,330,695 | 7/1967 | Curran | 428/209 |
| 3,672,986 | 6/1972 | Schineble, Jr. et al. | 428/209 |
| 4,595,606 | 6/1986 | St. John et al. | 428/901 |
| 4,664,962 | 5/1987 | DesMarais, Jr. | 428/209 |
| 5,232,765 | 8/1993 | Yano et al. | 428/210 |
| 5,326,636 | 7/1994 | Durand et al. | 428/209 |
| 5,346,750 | 9/1994 | Hatakeyama et al. | 428/209 |
| 5,481,795 | 1/1996 | Hatakeyama et al. | 428/901 |
| 5,652,042 | 7/1997 | Kawakita et al. | 428/209 |

Primary Examiner—Cathy F. Lam
Attorney, Agent, or Firm—Beveridge, DeGrandi, Weilacher & Young, LLP

[57] ABSTRACT

A circuit board comprising a board body which includes an insulating substrate or a plurality of laminated insulating substrates. The circuit board includes a connection material for electrically connecting together circuit patterns that are formed on both surfaces of the board body and/or a connection material for electrically connecting together a circuit pattern formed on one surface of the board body and circuit patterns formed between the insulating substrates. The connection material is constituted by an electrically conducting substance filled in a through-hole formed in the board body, and at least one end surface of the electrically conducting substance is substantially flush with the circuit pattern formed on one surface of the board body. An electrically conducting pattern having a substantially uniform thickness is formed to cover a connection region between the one end surface of the electrically conducting substance and one of the circuit patterns, the electrically conducting pattern being composed of a cured product of a curable electrically conducting substance.

20 Claims, 7 Drawing Sheets

Fig. 16-A
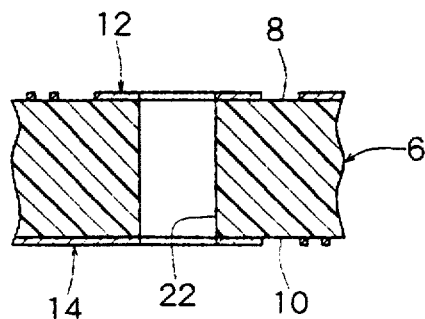
Fig. 16-B
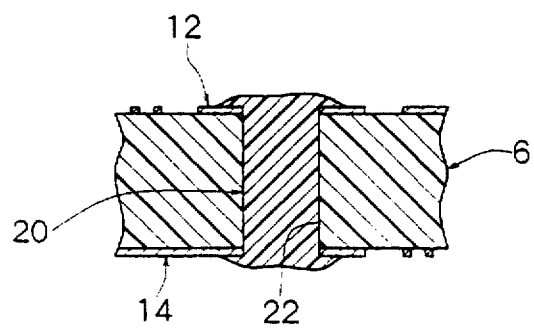
Fig. 16-C
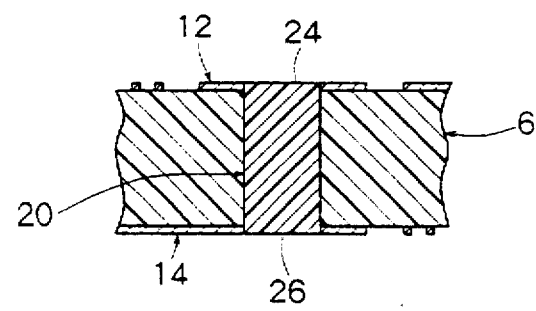
Fig. 16-D
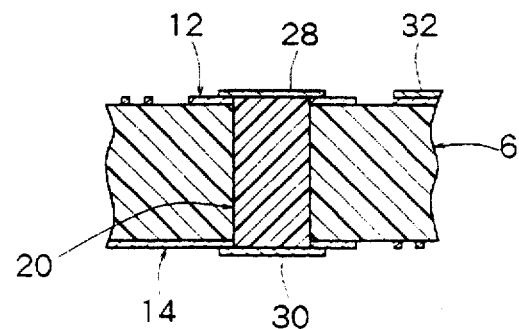

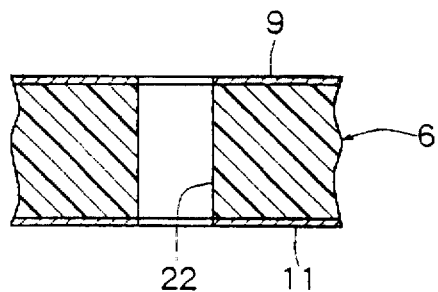
Fig. 17-A
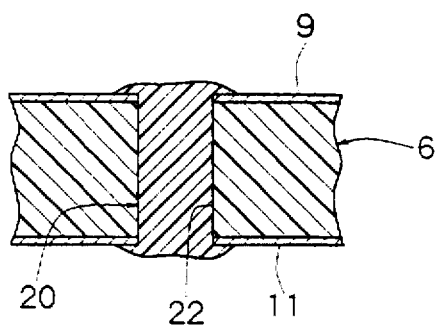
Fig. 17-B
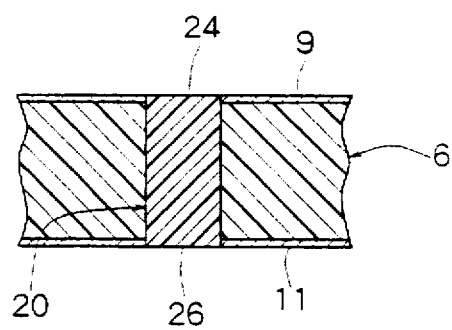
Fig. 17-C
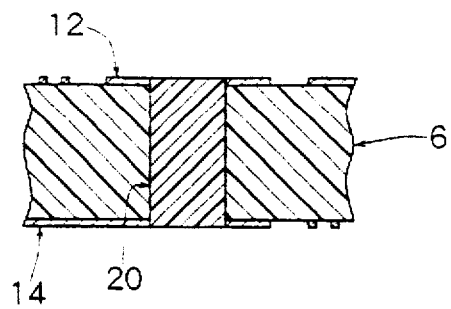
Fig. 17-D
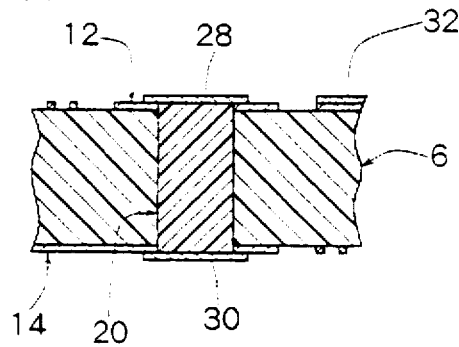
Fig. 17-E Fig. 18-A
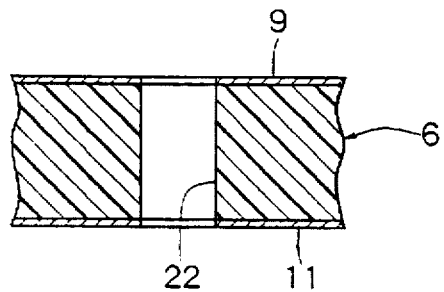
Fig. 18-B
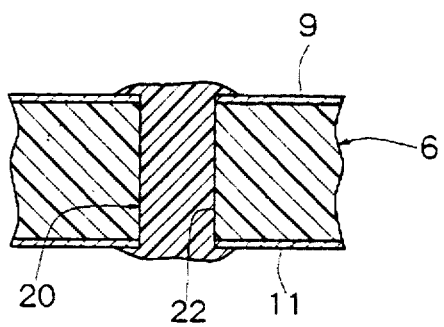
Fig. 18-C
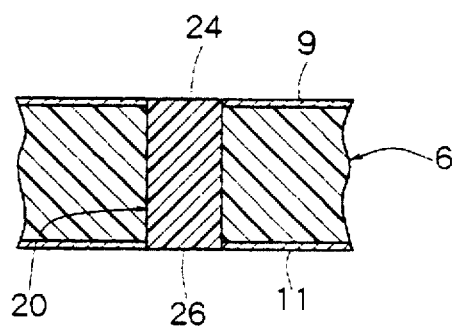
Fig. 18-D
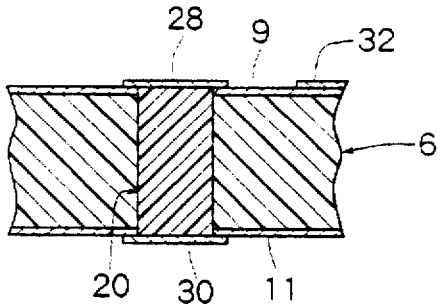
Fig. 18-E
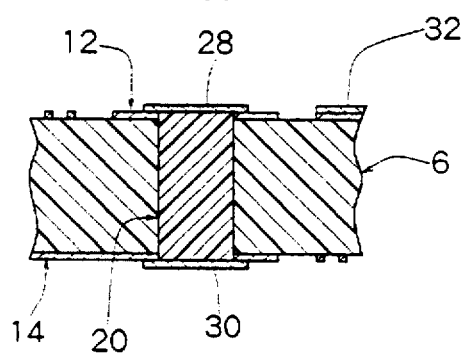

CIRCUIT BOARD

FIELD OF THE INVENTION

The present invention relates to a circuit board comprising a board body which includes a single insulating substrate or a plurality of laminated insulating substrates, and a connection means for electrically connecting a circuit pattern formed on one surface of the board body to a circuit pattern formed on the other surface of the board body and/or to circuit pattern formed between the insulating substrates.

DESCRIPTION OF THE PRIOR ART

A typical circuit board includes a board body constituted by an insulating substrate, circuit patterns formed on both surfaces of the board body, and a connection means for electrically connecting together the circuit patterns formed on both surfaces of the board body. Such a circuit board is usually obtained (a) by forming a through-hole in the board body having electrically conducting layers on both surfaces thereof by drilling or punching, forming a connection means by chemically plating and electro-plating to the through-hole and, then, forming circuit patterns on the electrically conducting layers by etching, or (b) by forming a through hole in the board body having electrically conducting layers on both surfaces thereof by drilling or punching, forming circuit patterns on the electrically conducting layers by etching, filling the through-hole with a curable electrically conducting substance such as copper paste or silver paste by a screen-printing method or pin-insertion method, and curing the electrically conducting substance to form a connection means.

According to the above-mentioned method (a) of forming the circuit board, however, plating must be effected more than two times to enhance reliability of the connection means, which is not necessarily advantageous from the standpoint of cost. Besides, since the electroplating is effected for the whole surfaces of the board body, the thickness of the electrically conducting layers becomes irregular, and etching for forming the circuit patterns is effected unevenly. Therefore, this method is not suited for obtaining circuit boards having fine circuit patterns.

The above-mentioned method (b) of producing the circuit board features decreased number of production steps since no chemical plating or electroplating needs be effected on the through-hole for forming the connection means. Therefore, the above method (b) has been increasingly employed in recent years. In order to maintain reliable electric connection between the connection means formed by filling an electrically conducting substance and the wiring portions of circuit patterns, however, the electrically conducting substance is needed to cover even the periphery of the through-hole in a manner to protrude beyond the surfaces of the board body. As a result, uneven surfaces of the board body caused by the protruded electrically conducting substance hinder the operation for printing a solder paste for mounting the surface-mounting parts thereon, and prevent the operation for connecting the surface-mounting parts with good reliability.

In order to improve the defect of the circuit board produced by the above-mentioned method (b), Japanese Patent Laid-Open Publication No. 67874/1993 discloses a method according to which a through-hole is filled with a curable electrically conducting substance in a protruding manner and, after cured, the protruding portions of the electrically conducting substance are ground to be flush with the electrically conducting layers formed on both surfaces of the board body thereby to form a connection means and then, circuit patterns are formed by subjecting the electrically conducting layers to an etching treatment. This publication further discloses technology according to which a common plated layer is formed on the electrically conducting substance of the connection means and on the electrically conducting layers, and the electrically conducting layers are then etched to form circuit patterns in order to improve reliability in the electric connection between the circuit patterns and the connection means.

The circuit board disclosed in the above Japanese Patent Laid-Open Publication No. 67874/1993 has surfaces which are little uneven, permits the solder paste to be well printed in mounting the surface-mounting parts thereon, and enables the surface-mounting parts to be reliably connected. However, a plating layer must be further formed on the electrically conducting layers still leaving some problem in forming fine circuit patterns though the problem is not so serious as that of the circuit board produced by the above-mentioned method (a).

SUMMARY OF THE INVENTION

The principal object of the present invention is to provide a novel and improved circuit board which features highly reliable electric connection between the connection means and the circuit patterns formed on the surfaces of the board body, is not adversely affected in etching treatment for forming circuit patterns by formation of a connection means, and hence, can be well used for forming highly fine circuit patterns.

Another object of the present invention is to provide a novel and improved circuit board which makes it possible to print a solder paste highly precisely at the time of mounting the surface-mounting parts and hence, enables the surface-mounting parts to be reliably connected thereto.

A further object of the present invention is to provide a novel and improved circuit board which can be produced with a high yield and offers a high mounting density and a high wiring density.

Through keen study and experiment, the present inventors have discovered that the above-mentioned objects can be accomplished by filling a through-hole formed in a board body with an electrically conducting substance to form a connection means, forming at least one end surface of the electrically conducting substance so as to be substantially flush with a circuit pattern formed on one surface of the board body, and covering a connection region between the circuit pattern and the one end surface of the electrically conducting substance constituting the connection means with an electrically conducting pattern which is composed of a cured product of a curable electrically conducting substance and which has a substantially uniform thickness.

According to one aspect of the present invention, there is provided a circuit board comprising a board body including at least one insulating substrate, circuit patterns formed on both surfaces of said board body, and a connection means for electrically connecting together the circuit patterns formed on both surfaces of the board body, wherein:

The connection means is constituted by an electrically conducting substance filled in a through-hole formed in the board body, at least one end surface of the electrically conducting substance being substantially flush with one of the circuit patterns; and An electrically conducting pattern having a substantially uniform thickness is formed to cover a connection region between said one end surface of said electrically conducting substance and one of said circuit patterns, the electrically conducting pattern being composed of a cured product of a curable electrically conducting substance.

According to another aspect of the present invention, there is provided a circuit board comprising a board body including a plurality of laminated insulating substrates, a surface-layer circuit pattern formed on at least one surface of the board body, inner-layer circuit pattern formed between the insulating substrates, and a connection means for electrically connecting together the surface-layer circuit pattern and the inner-layer circuit patterns, wherein:

The connection means is constituted by an electrically conducting substance filled in a through-hole formed in the board body, one end surface of the electrically conducting substance being substantially flush with said surface-layer circuit pattern formed on one surface of said board body; and An electrically conducting pattern having a substantially uniform thickness is formed to cover a connection region between the one end surface of the electrically conducting substance and the surface-layer circuit pattern, the electrically conducting pattern being composed of a cured product of a curable electrically conducting substance.

Desirably, the through-hole formed in the board body should have a circular shape in cross section with a diameter of from 0.1 to 2 mm. The electrically conducting substance constituting the connection means is in the form of a paste obtained by mixing an electrically conducting powder and a crosslinking thermosetting resin, and is cured after it has been filled in the through-hole. The electrically conducting powder may be at least any one of gold, silver, copper, nickel, lead or carbon, and the thermosetting resin may be an epoxy resin. The curable electrically conducting substance constituting the electrically conducting patterns is preferably in the form of a paste obtained by mixing an electrically conducting powder and a crosslinking thermosetting resin. The electrically conducting powder may be at least any one of gold, silver, copper, nickel, lead or carbon, and the thermosetting resin may be a resol-type phenol resin. Preferably, the electrically conducting substance constituting the connection means is curable, and has an electric resistance after cured of not larger than $1 \times 10^{-2}$ $\Omega$-cm. Desirably, the curable electrically conducting substance constituting the electrically conducting patterns can be subjected to a soldering or nickel-gold plating, after cured. In a preferred embodiment, the electrically conducting pattern covers substantially the whole one end surface of the connection means and a connection edge portion of the circuit pattern, the connection edge portion being connected to the one end surface of the connection means of the circuit patterns. It is desired that the connection edge portion of the circuit patterns covered with the electrically conducting pattern has a width of not smaller than 0.05 mm. The circuit pattern has a land portion surrounding the one end surface of the connection means, and the electrically conducting pattern desirably covers substantially the whole one end surface of the connection means and the land portion of the circuit pattern. The electrically conducting pattern may have a tear-drop shape. In another preferred embodiment, the circuit pattern has a land portion surrounding the one end surface of the connection means, and the electrically conducting pattern has a doughnut shape covering the one end surface of the connection means except its central portion and covering the land portion of the circuit pattern. The electrically conducting pattern may have a thickness of from 5 to 100 μm.

BRIEF DESCRIPTION OF THE DRAWINGS

FIGS. 16-A to 16-D are sectional views illustrating the steps for producing the circuit board shown in FIG. 1 according to an embodiment;

FIGS. 17-A to 17-E are sectional views illustrating the steps for producing the circuit board shown in FIG. 1 according to another embodiment; and FIGS. 18-A to 18-E are sectional views illustrating the steps for producing the circuit board shown in FIG. 1 according to a further embodiment.

DETAILED DESCRIPTION OF THE PREFERRED EMBODIMENTS

Preferred embodiments of the present invention will be described in further detail with reference to the accompanying drawings.

Figure 1:
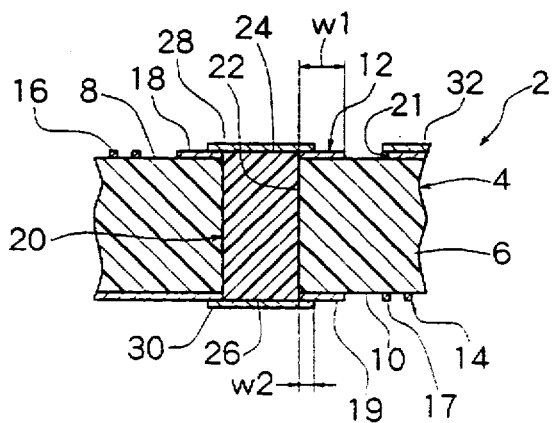
FIG. 1 is a sectional view illustrating a circuit board in which a board body is constituted by a single insulating substrate according to a preferred embodiment of the present invention.

Referring to FIG. 1, a circuit board generally designated at 2 includes a board body 4 constituted by an insulating substrate 6. The insulating substrate 6 may be in any form such as paper base-phenolic resin laminated substrate, paper base-epoxy resin laminated substrate, paper base-polyester resin laminated substrate, glass base-epoxy resin laminated substrate, paper base-teflon resin laminated substrate, glass base-polyimide resin laminated substrate, glass base-BT (bismaleimide-triazine) resin laminated substrate, or a synthetic resin substrate such as composite resin board, or a flexible substrate such as of polyimide resin or polyester resin, or a metallic insulating substrate of aluminum, steel, stainless steel and the like coated with an epoxy resin to have electrically insulating property, or a ceramic substrate.

Circuit patterns 12 and 14 are respectively formed on both surfaces of the board body 4, i.e., on an upper surface 8 and on a lower surface 10. As will be easily understood with reference to FIG. 1 as well as FIGS. 2 and 3, the circuit patterns 12 and 14 usually include wiring portions 16 and 17, land portions 18 and 19, and pad portions 21. The circuit patterns 12 and 14 can be formed by using a suitable electrically conducting material. Here, however, typical examples of the material forming the circuit patterns 12 and 14 may be copper and nickel. Desirably, the circuit patterns 12 and 14 have a thickness which is usually from about 5 to about 70 μm.

The circuit board 2 shown in FIG. 1 has, at a required position, a connection means 20 for electrically connecting together the circuit pattern formed on the upper surface 8 of the board body 4 and the circuit pattern 14 formed on the lower surface 10. A through-hole 22 is formed in the board body 4 at a required position penetrating therethrough in the direction of thickness, and the connection means 20 is constituted by an electrically conducting substance filled in the through-hole 22. It is desired that the through-hole 22 has a circular shape in cross section with a diameter which is sufficiently small but is large enough for being filled with the electrically conducting substance, i.e., which is from about 0.1 to about 2.0 mm and, particularly, from about 0.2 to about 2.0 mm. As desired, the through-hole may be formed in the board body 4 in a rectangular shape, polygonal shape, oval shape or in any other suitable shape in cross section. It is desired that the electrically conducting substance constituting the connection means 20 is a curable electrically conducting substance that becomes, after cured, a cured product having electrically conducting property from the standpoint of easily filling the through-hole 22 with the electrically conducting substance in a step of forming the connection means 20 (which will be described later).

As the curable electrically conducting substance, there can be used a known curable electrically conducting substance in the form of a paste which is obtained by mixing an electrically conducting powder of an electrically conducting material such as gold, silver, copper, nickel, lead or carbon and a crosslinking thermosetting resin such as phenol resin and, as required, an organic solvent. It is desired to select from these curable electrically conducting substances the one that forms a cured product which is not substantially dissolved by an etching solution that will be used for the etching treatment, such as ferric chloride etching solution, cupric chloride etching solution, ammonium persulfate etching solution, sodium persulfate etching solution, potassium persulfate etching solution, hydrogen peroxide/sulfuric acid etching solution, or alkaline etching solution composed chiefly of ammonium sulfate complex ions.

Preferably, the connection means 20 has an electric resistance of not larger than $1 \times 10^{-2}$ Ω·cm and hence, it is desired to select the material and amount of the electrically conducting powder so as to obtain the above-mentioned electric resistance.

It is desired that the electrically conducting powder is composed of a metal that hardly causes migration from the standpoint of maintaining reliable insulation from the neighboring connection means 20. Copper is particularly desired from the standpoint of electrically conducting property, operation for preventing oxidation and cost. A particularly preferred example of the thermosetting resin is an epoxy resin since it forms by-products in less amounts in the curing.

With reference to FIG. 1, both end portions of the connection means 20 constituted by the electrically conducting substance filled in the through-hole 22 protrude beyond both surfaces of the board body 4. In the circuit board constituted according to the present invention, it is important that at least one end surface of the connection means 20 is substantially flush with the circuit pattern 12 or 14 formed on the surface of the board body 4 from the standpoint of favorably sufficiently excellently effecting the solder paste printing at the time of mounting the surface-mounting parts, thereby to enable reliably connecting the surface-mounting parts and forming the electrically conducting patterns that will be later described with high precision. In the embodiment shown in FIG. 1, both ends of the connection means 20, i.e., an upper end surface 24 and a lower end surface 26 are substantially flush with the circuit patterns 12 and 14 formed on the upper surface 8 and on the lower surface 10 of the board body 4.

Figure 2:
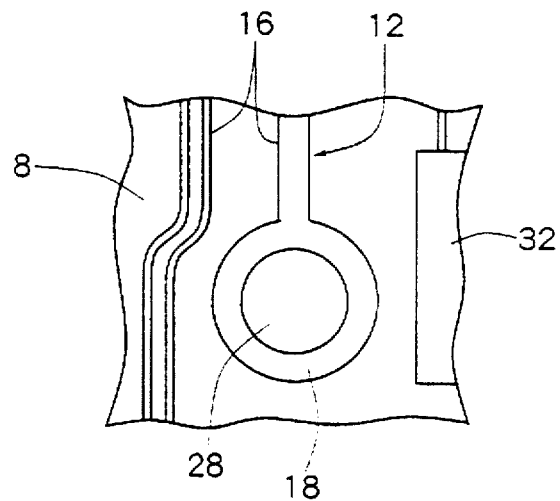
FIG. 2 is a plan view of the circuit board of FIG. 1.
Figure 3:
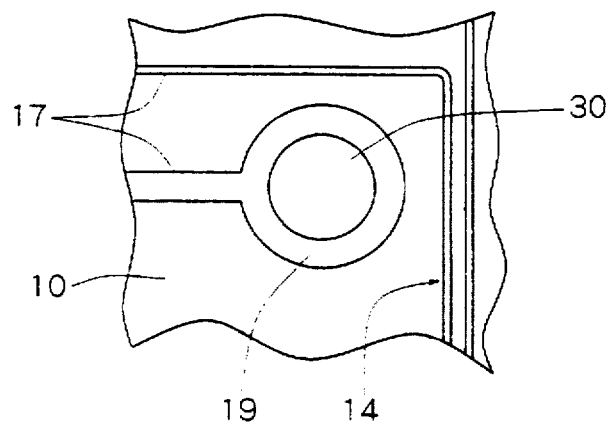
FIG. 3 is a bottom view of the circuit board of FIG. 1.

With further reference to FIGS. 1 to 3, both end portions of the connection means 20 protrude beyond both surfaces of the board body 4 as described above, and are surrounded by the land portions 18 and 19 of the circuit patterns 12 and 14. The land portions 18 and 19 may be of an annular shape concentric with the connection means 20. It is desired that the land portions 18 and 19 surrounding both end portions of the connection means 20 have a width w1 which is not smaller than 0.05 mm. When the width w1 of the land portions 18 and 19 is too great, wiring densities of the circuit patterns 12 and 14 decrease. It is therefore desired that the land portions 18 and 19 have a width w1 which is not larger than 2 mm.

It is important that the connection region between the upper end 24 of the connection means 20 and the land portion 18 of the circuit pattern 12 is covered with an electrically conducting pattern 28, thereby to maintain a required electric connection between the connection means 20 and the circuit pattern 12. Similarly, it is important that the connection region between the lower end surface 26 of the connection means 20 and the land portion 19 of the circuit pattern 14 is covered with an electrically conducting pattern 30, thereby to maintain a required electric connection between the connection means 20 and the circuit pattern 14. It is important that the electrically conducting patterns 28 and 30 are composed of a cured product of a curable electrically conducting substance and having substantially a uniform thickness (method of forming such electrically conducting patterns 28 and 30 will be described later). In the embodiment shown in FIGS. 1 to 3, the electrically conducting patterns 28 and 30 are of a circular shape, and cover substantially the whole end surfaces (24 and 26) of the connection means 20 and the inner peripheral edge portion of the land portions 18 and 19 of the circuit patterns 12 and 14. It is desired that the inner peripheral edge portion of the land portions 18 and 19 covered with the electrically conducting patterns 28 and 30 have a width w2 which is not smaller than 0.05 mm from the standpoint of achieving the reliable electric connection.

As will be easily understood with reference to FIGS. 1 and 2, a pad portion 21 of the circuit pattern 12 can be also covered with an electrically conducting pattern 32. When the pad portion 21 has a rectangular shape, the electrically conducting pattern 32 has a rectangular shape, too, and can cover substantially the whole pad portion 21.

Figure 4:
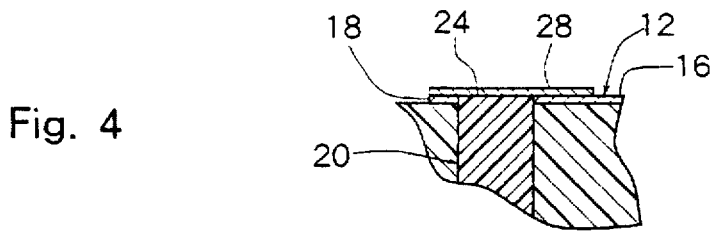
FIG. 4 is a sectional view of an electrically conducting pattern according to a modified embodiment.
Figure 5:
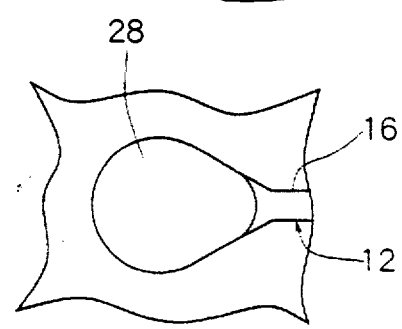
FIG. 5 is a plan view of the electrically conducting pattern of FIG. 4.
Figure 6:
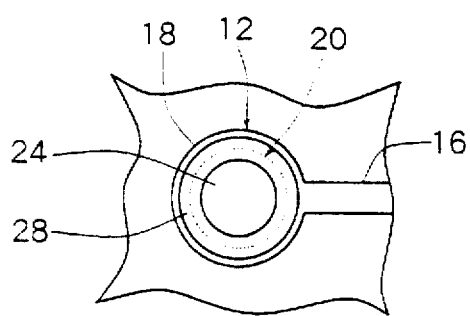
FIG. 6 is a plan view of the electrically conducting pattern according to another modified embodiment.

The electrically conducting patterns 28 and 30 that reliably and electrically connect the connection means 20 to the circuit patterns 12 and 14, are not limited to those of circular ones as shown in FIGS. 2 and 3, and may be formed in a variety of shapes. In an embodiment shown in FIGS. 4 and 5, the circuit pattern 12 has the land portion 18 surrounding an end portion of the connection means 20 and a wiring 16 that extends from the land portion 18. A connection portion where the wiring 16 is connected to the land portion 18 is gradually broadened toward the land portion 18. The electrically conducting pattern 28 that connects the connection means 20 to the circuit pattern 12 has a shape of a tear-drop as a whole, and covers substantially the whole one end surface 24 of the connection means 20, substantially the whole land portion 18 of the circuit pattern 12, and part of the gradually broadening portion of the wiring 16. The electrically conducting pattern 28 having such a tear-drop shape makes it possible to sufficiently improve reliability in the electric connection between the connection means 20 and the circuit pattern 12. In the embodiment shown in FIG. 6, the circuit pattern 12 has the concentrically annular land portion 18 which surrounds one end surface 24 of the connection means 20, and a wiring 16 that extends from the land portion 18. The electrically conducting pattern 28 has the shape of a doughnut and surrounds the annular portion of one end surface 24 of the connection means 20 excluding the central portion thereof and an annular portion of the land portion 18 of circuit pattern 12 excluding the outer peripheral edge portion of the land portion 18 of circuit pattern 12. In the electrically conducting pattern 28 of such a shape, the material amount requiring for forming the conducting pattern can become smaller than that of the material used for forming the electrically conducting pattern 28 of the shape shown in FIGS. 1 to 3, 4 and 5.

Figure 7:
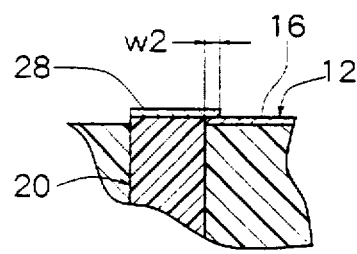
FIG. 7 is a sectional view illustrating a relationship between a connection means and a circuit pattern according to a modified embodiment.
Figure 8:
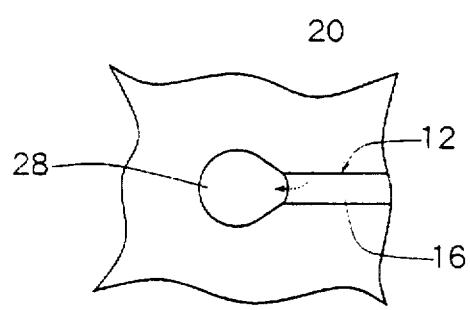
FIG. 8 is a plan view illustrating the relationship between the connection means and the circuit pattern shown in FIG. 7 according to a modified embodiment.

In order to reliably connect the connection means 20 to the circuit patterns 12 and 14 as in the embodiment shown in FIGS. 1 to 3, it is desired that the end portions of the connection means 20 are surrounded by the land portions 18 and 19 of circuit patterns 12 and 14, and that the electrically conducting patterns 28 and 30 are formed spanning across the end surfaces 24 and 26 of the connection means 20 and the land portions 18 and 19 of the circuit patterns 12 and 14. As desired, however, land portions may not be formed and, instead, the wirings of the circuit patterns may be directly extended from the end portion of the connection means in order to form electrically conducting patterns spanning across the end surfaces of the connection means and the wirings of the circuit patterns. In an embodiment shown in FIGS. 7 and 8, an end portion of the connection means 20 is not surrounded by the land portion of the circuit pattern 12 and, instead, the wiring 16 of the circuit pattern 12 directly extends from one end portion of the connection means 20. A connecting portion where the wiring 16 of the circuit pattern 12 is connected to one end portion of the connection means 20 is gradually broadened toward the one end portion of the connection means 20. The electrically conducting pattern 28 for connecting the connection means 20 to the circuit pattern 12 has a tear-drop shape as a whole, and covers substantially the whole one end surface 24 of the connection means 20 and part of the gradually broadening portion of the wiring 16 of the circuit pattern 12. It is desired that the wiring 16 covered with the electrically conducting pattern 28 has a width w2 which is not smaller than 0.05 mm from the standpoint of achieving reliable electric connection.

Figure 9:
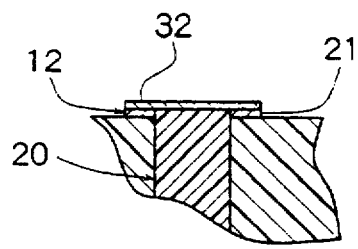
FIG. 9 is a sectional view illustrating the relationship between the connection means and the circuit pattern according to a further modified embodiment.
Figure 10:
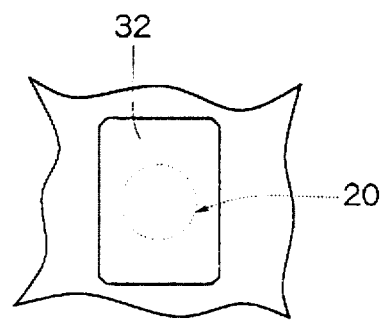
FIG. 10 is a plan view illustrating the relationship between the connection means and the circuit pattern shown in FIG. 9 according to a further modified embodiment.

In an embodiment shown in FIGS. 9 and 10, one end portion of the connection means 20 is surrounded by a pad portion 21 of the circuit pattern 12. The pad portion 21 has a rectangular shape, and there is provided a rectangular electrically conducting pattern 32 covering substantially the whole one end surface 24 of the connection means 20 and substantially the whole pad portion 21 of the circuit pattern 12.

The electrically conducting patterns 28, 30 and 32 will be described in further detail. It is important that the electrically conducting patterns 28, 30 and 32 have very uniform thicknesses and have substantially flat surfaces. This makes it possible to precisely print the solder paste for mounting parts and to precisely form an overcoat layer, contributing to enhancing reliability in the connection of surface-mounting parts. Besides, the surface-mounting parts are stably mounted on the electrically conducting patterns 28, 30 and 32. It is thus made possible to directly connect the surface-mounting parts to the electrically conducting patterns 28, 30 and 32 and hence to increase the part-mounting density.

It is desired that the electrically conducting patterns 28, 30 and 32 have thicknesses of from 5 to 100 µm from the standpoint of reliability of the connection means 20 and printability of the solder paste and, particularly preferably, have thicknesses of from 5 to 50 µm from the standpoint of very easily mounting the parts. It is desired that fluctuation in the thicknesses of the electrically conducting patterns 28, 30 and 32 is suppressed to be ±30% or less of the average thicknesses though it may vary depending upon the method of forming electrically conducting patterns 28, 30 and 32 and the sizes of the portions connecting the surface-mounting parts.

The electrically conducting patterns 28, 30 and 32 may be composed of the same material as the curable electrically conducting substance that is used for forming the connection means 20. It is, however, desired to use a curable electrically conducting substance capable of forming a cured product having superior moistureproof property to that of the electrically conducting substance that forms the connection means 20. By forming electrically conducting patterns 28, 30 and 32 having excellent moistureproof property, it is allowed to obtain a circuit board having excellent reliability and, particularly, excellent moistureproof property. Desirably, the curable electrically conducting substance for forming the electrically conducting patterns 28, 30 and 32 is in the form of a paste that is obtained by mixing an electrically conducting powder, a crosslinking thermosetting resin and, as required, an organic solvent.

As the electrically conducting powder, there can be preferably used a metal such as gold, silver, copper, nickel or lead that is hardly oxidized and has a small resistivity, or carbon which is not at all oxidized though the resistivity may be slightly large. Among the above-mentioned electrically conducting materials, furthermore, it is desired to select a metal that causes little migration from the standpoint of maintaining reliable electric insulation from the neighboring circuit patterns 12 and 14. Copper is particularly preferably used from the standpoint of electrically conducting property, operation for preventing oxidation and cost.

As the thermosetting resin, it is desired to use a resol-type phenol resin that works as a binder and produces a reducing atmosphere at the time of thermosetting, so that a metal such as copper or the like is prevented from being oxidized.

When the resol-type phenol resin is used as a thermosetting resin for the curable electrically conducting substance for forming the connection means 20, it is a posibility that voids occur in the through-hole 22 due to moisture and formalin produced as by-products at the time of heat-setting the resin and as a result, the cured product of the curable electrically conducting substance filled in the through-hole 22 loses electrically conducting property, whereby circuit patterns 12 and 14 near the through-hole 22 lose reliability. Despite of these facts, however, the electrically conducting patterns 28, 30 and 32 can be favorably formed by using the resol-type phenol resin.

As described above, furthermore, it is desired that the curable electrically conducting substance for forming the connection means 20 in the through-hole 22 employs, as a binder component, an epoxy resin binder comprising a curing agent and an epoxy resin that little produces by-products when the binder undergoes the curing. However, the curable electrically conducting substance using such a binder exhibits inferior moistureproof property to the curable electrically conducting substance that chiefly uses the above-mentioned resol-type phenol resin as a binder. According to the above-mentioned embodiment of the present invention, however, it is allowed to protect the curable electrically conducting substance having poor moistureproof property for forming the connection means 20 by using high moistureproof property of the electrically conducting patterns 28, 30 and 32.

It is further desired that the cured product forming the connection means 20 has a thermal expansion coefficient which is close to that of the cured product forming the electrically conducting patterns 28, 30 and 32. When the two cured products have thermal expansion coefficients that are close to each other, thermal stress produced by the reflow at the time of mounting the parts is small and hence, improved reliability is obtained.

According to an embodiment of the present invention, it is advisable that the through-hole 22 is filled with a curable electrically conducting substance using an epoxy resin-type binder that little produces by-products when the binder is being cured to form the connection means 20, and that the electrically conducting patterns 28, 30 and 32 covering the connection regions between the connection means 20 and the circuit patterns 12 and 14 are formed by using a paste which uses a resol-type phenol resin as a main binder component and copper that hardly causes migration as a metal component. This makes it possible to obtain a circuit board that is free from defect in the connection means 20 and has excellent moistureproof property.

Various known technologies can be applied without any particular limitation to the constitution of the circuit board 2 of the present invention except the connection means 20 and the electrically conducting patterns 28 and 30. For instance, the circuit patterns 12 and 14, except the connection terminal portions, may be protected by forming an overcoat layer by using a known insulating resin (resist). Moreover, an insulating layer may be formed on the surfaces of the circuit patterns 12 and 14 except the connection terminal portions, and circuit patterns of a plated layer such as of copper may be formed on the insulating layer. In a circuit board in which the surface-mounting parts are mounted on one surface only, the electrically conducting substance is allowed to exist around the periphery of the through-hole on the surface on which no part is mounted, and the electrically conducting substance is allowed to protrude beyond the surface of the circuit board in a customary manner.

Moreover, the surface-mounting parts can be directly connected onto the electrically conducting patterns 28, 30 and 32 and, hence, the part-mounting density can be increased when the electrically conducting patterns 28, 30 and 32 that are so formed as to cover the connection regions between the connection means 20 and the circuit patterns 12 and 14, are formed of a curable electrically conducting substance that forms a cured product enabling a solder to be applied thereon or that forms a cured product enabling nickel-gold plating that is used for forming ordinary terminals to be plated thereon.

Figure 11:
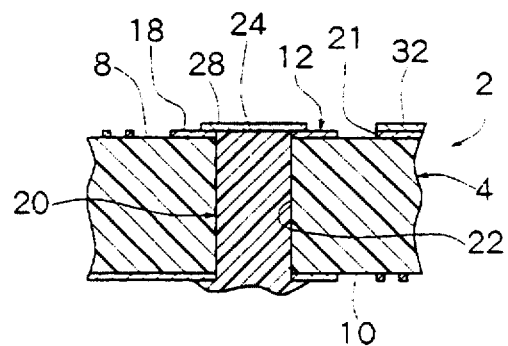
FIG. 11 is a sectional view illustrating a circuit board in which the board body is constituted by a single insulating substrate according to a modified embodiment of the present invention.
Figure 12:
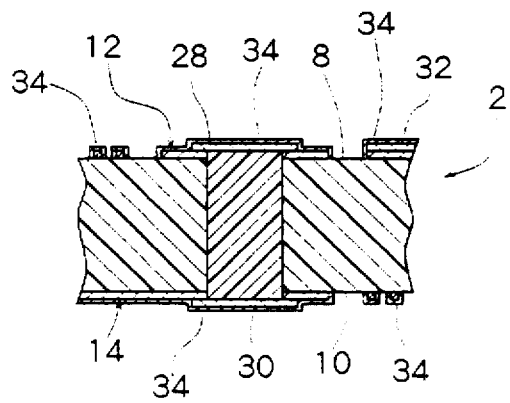
FIG. 12 is a sectional view illustrating a circuit board in which the board body is constituted by a single insulating substrate according to a further modified embodiment of the present invention.

FIGS. 11 and 12 illustrate a modified embodiment of the circuit board constituted according to the present invention. In the circuit board 2 shown in FIG. 11, the upper end surface 24 of the connection means 20 is substantially flush with the circuit pattern 12 on the upper surface 8 only of the board body 4 on which the surface-mounting parts are mounted, and an electrically conducting pattern 28 is formed to cover the upper end surface 24 of the connection means 20 and the land portion 18 of the circuit pattern 12, and an electrically conducting pattern 32 is formed to cover the pad portion 21 of the circuit pattern 12. On the lower surface 10 of the board body 4 on which no surface-mounting part is mounted, the electrically conducting substance forming the connection means 20 overflows from the through-hole 22 onto the land portion 19 of the circuit pattern 14. Therefore, the lower surface 10 of the board body 4 is not flat. In the circuit board 2 shown in FIG. 12, a nickel-gold plated layer 34 is plated on the circuit patterns 12 and 14 and on the electrically conducting patterns 28, 30 and 32 in both surfaces 8 and 10 of the board body 4. In the circuit board 2 of this embodiment, the surface-mounting parts can be electrically connected to the nickel-gold plated layer 34 and hence, the electrically conducting patterns 28, 30 and 32 can be made of a material having poor solder-wetting property. Except the above-mentioned points, the circuit boards 2 shown in FIGS. 11 and 12 have substantially the same constitution as that of the circuit board 2 shown in FIGS. 1 to 3.

Figure 13:
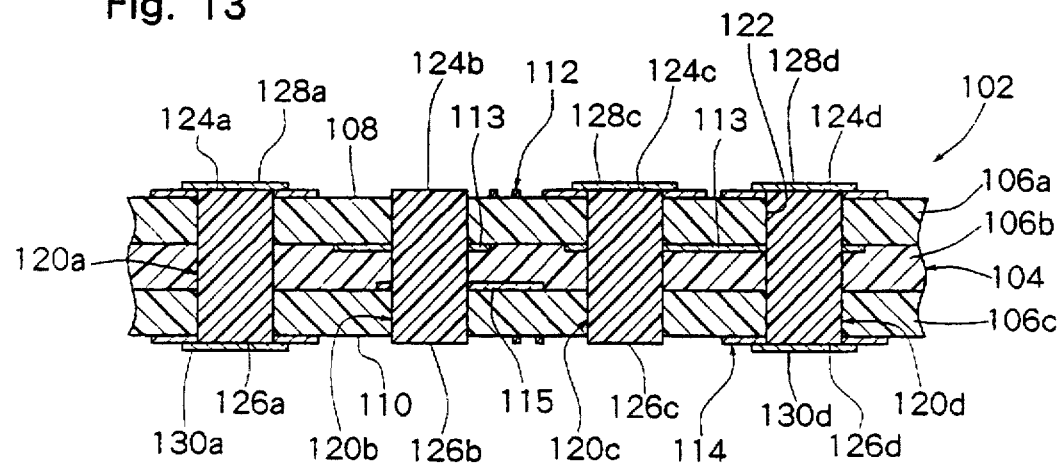
FIG. 13 is a sectional view illustrating a circuit board in which the board body is constituted by a plurality of laminated insulating substrates according to a preferred embodiment of the present invention.

FIG. 13 illustrates a circuit board constituted according to a further modified embodiment of the present invention. In a circuit board 102 shown in FIG. 13, a board body 104 is constituted by three laminated insulating substrates 106a, 106b and 106c. The number of the insulating substrates to be laminated can be suitably selected depending upon the requirement. In the circuit board 102, a circuit pattern 113 is formed between the insulating substrate 106a and the insulating substrate 106b, and a circuit pattern 115 is formed between the insulating substrate 106b and the insulating substrate 106c, in addition to the circuit patterns 112 and 114 that are formed on the upper surface 108 and on the lower surface 110 of the board body 104. This board body 104 can be formed by a customary manner such as a pin-laminate method or a mass-laminate method in which the insulating substrates 106a, 106b and 106c on which the circuit patterns 113 and 115 (and, as required, circuit patterns 112 and 114) have been formed in advance, are laminated one upon the other with pre-pregs sandwiched between them. The circuit board 102 has four kinds of connection means 120a, 120b, 120c and 120d. The connection means 120a electrically connects the circuit pattern 112 formed on the upper surface 108 of the board body 104 to the circuit pattern 114 formed on the lower surface of the board body 104. The connection means 120b electrically connects the circuit pattern 113 formed between the insulating substrate 106a and the insulating substrate 106b to the circuit pattern 115 formed between the insulating substrate 106b and the insulating substrate 106c. The connection means 120c electrically connects the circuit pattern 112 formed on the upper surface 108 of the board body 104 to the circuit pattern 113 formed between the insulating substrate 106a and the insulating substrate 106b. The connection means 120d electrically connects together the circuit pattern 112 formed on the upper surface 108 of the board body 104, the circuit pattern 113 formed between the insulating substrate 106a and the insulating substrate 106b, and the circuit pattern 115 formed on the lower surface 110 of the board body 104. Upper end surfaces 124a, 124b, 124c and 124d of the connection means 120a, 120b, 120c and 120d are substantially flush with the circuit pattern 112 formed on the upper surface 108 of the board body 104. Furthermore, lower end surfaces 126a, 126b, 126c and 126d of the connection means 120a, 120b, 120c and 120d are substantially flush with the circuit pattern 114 formed on the lower surface 110 of the board body 104. As for the connection means 120a, there are formed an electrically conducting pattern 128a covering the connection region between the upper end surface 124a and the circuit pattern 112, and an electrically conducting pattern 130a covering the connection region between the lower end surface 126a and the circuit pattern 114. No electrically conducting pattern is formed for the connection means 120b that is connected neither to the circuit pattern 112 nor to the circuit pattern 114. As for the connection means 120c, an electrically conducting pattern 128c is formed to cover the connection region between the upper end surface 124c and the circuit pattern 112. No electrically conducting pattern is formed for the lower end surface 126c of the connection means 120c that is not connected to the circuit pattern 114. As for the connection means 120d, there are formed an electrically conducting pattern 128d covering the connection region between the upper end surface 124d and the circuit pattern 112, and an electrically conducting pattern 130d covering the connection region between the lower end surface 126d and the circuit pattern 114. The connection means 120a, 120b, 120c, 120d and the electrically conducting patterns 128a, 128c, 128d, 130a, 130b have substantially the same constitutions as those of the connection means 20 and electrically conducting patterns 28 and 30 of the circuit board 2 described with reference to FIGS. 1 to 3.

Figure 14:
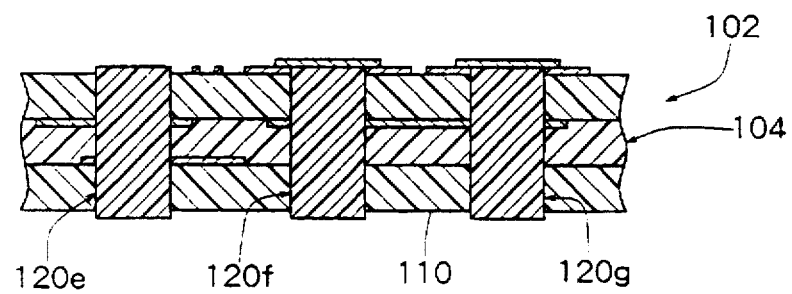
FIG. 14 is a sectional view illustrating the circuit board in which the board body is constituted by a plurality of laminated insulating substrates according to a modified embodiment.
Figure 15:
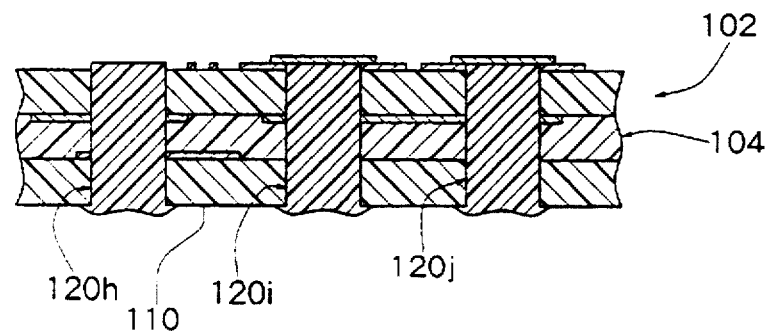
FIG. 15 is a sectional view illustrating the circuit board in which the board body is constituted by a plurality of laminated insulating substrates according to a further modified embodiment.

FIGS. 14 and 15 illustrate circuit boards 102 according to modified embodiments in which the board bodies 104 are each made up of three insulating substrates 106a, 106b and 106c. In the circuit board 102 shown in FIG. 14, no circuit pattern is formed on the lower surface of the board body 104. In FIG. 14, there are provided three connection means 120e, 120f and 120g. The connection means 120e is substantially the same as the connection means 120b in the circuit board 102 shown in FIG. 13, and the connection means 120f and 120g are substantially the same as the connection means 120c in the circuit board 102 shown in FIG. 13. In other respects, the circuit board 102 shown in FIG. 14 has substantially the same constitution as that of the circuit board 102 shown in FIG. 13. The circuit board 102 shown in FIG. 15 has three connection means 120h, 120i and 120j. On the lower surface 110 of the circuit board 102 on which no surface-mounting part is mounted, the electrically conducting substance forming the connection means 120h, 120i and 120j is overflows onto the lower surface of the board body 104 and, hence, the lower surface of the circuit board 102 is not flat. In other respects, the circuit board 102 shown in FIG. 15 has substantially the same constitution as that of the circuit board 102 shown in FIG. 14.

FIGS. 16-A to 16-D, FIGS. 17-A to 17-E, and FIGS. 18-A to 18-E illustrate typical methods of producing the circuit board 2 of the form explained with reference to FIGS. 1 to 3.

According to the production method illustrated in FIGS. 16-A to 16-D:

(A) the through-hole 22 is perforated in the insulating substrate 6 at a portion where it is necessary to electrically connect the circuit pattern 12 formed on the upper surface 8 of the insulating substrate 6 to the circuit pattern 14 formed on the lower surface 10 of the insulating substrate 6;

(B) the through-hole 22 is filled with a curable electrically conducting substance which is then cured to form the connection means 20;

(C) the upper end surface 24 of the connection means 20 is ground so as to become substantially flush with the circuit pattern 12, and the lower end surface 26 of the connection means 20 is ground so as to become substantially flush with the circuit pattern 14; and (D) a curable electrically conducting substance is applied to required portions on both surfaces of the insulating substrate 6 in order to form electrically conducting patterns 28, 30 and 32 having substantially uniform thicknesses.

According to the production method illustrated in FIGS. 17-A to 17-E:

(A) the through-hole 22 is perforated at a required portion in the insulating substrate 6 having electrically conducting layers 9 and 11 formed on both surfaces thereof;

(B) the through-hole 22 is filled with a curable electrically conducting substance which is then cured to form the connection means 20;

(C) the upper end surface 24 of the connection means 20 is ground so as to become substantially flush with the electrically conducting layer 9, and the lower end surface 26 of the connection means 20 is ground so as to become substantially flush with the electrically conducting layer 11;

(D) circuit patterns 12 and 14 are formed by subjecting the electrically conducting layers 9 and 11 to the etching treatment; and (E) a curable electrically conducting substance is applied to required portions on both surfaces of the insulating substrate 6 in order to form electrically conducting patterns 28, 30 and 32 having substantially uniform thicknesses.

According to the production method illustrated in FIGS. 18-A to 18-E:

(A) the through-hole 22 is perforated at a required portion in the insulating substrate 6 having electrically conducting layers 9 and 11 formed on both surfaces thereof;

(B) the through-hole 22 is filled with a curable electrically conducting substance which is then cured to form the connection means 20;

(C) the upper end surface 24 of the connection means 20 is ground so as to become substantially flush with the electrically conducting layer 9, and the lower end surface 26 of the connection means 20 is ground so as to become substantially flush with the electrically conducting layer 11;

(D) a curable electrically conducting substance is applied to required portions on both surfaces of the insulating substrate 6 in order to form electrically conducting patterns 28, 30 and 32 having substantially uniform thicknesses; and (E) circuit patterns 12 and 14 are formed by subjecting the electrically conducting layers 9 and 11 to the etching treatment.

The circuit boards 102 of the forms shown in FIGS. 13 to 15 in which the board bodies 104 are each constituted by a plurality of insulating substrates 106a, 106b and 106c, can be produced by the same production methods as those mentioned above. As required, a smear removal or etchback treatment is effected onto, the inner surface of the through-hole 22 formed in the board body 104, in order to secure a reliable electrical connection of the connection means 120 to the circuit patterns 113 and 115 formed among the insulating substrates 106a, 106b and 106c.

In the above-mentioned production methods, the through-holes 22 and 122 can be perforated by any suitable method such as drilling, punching or laser working.

It is desired that the through holes 22 and 122 formed in the board bodies 4 and 104 are filled with a curable electrically conducting substance in such amounts that the curable electrically conducting substance fills the whole space of the through-holes 22 and 122 and that the curable electrically conducting substance slightly protrudes beyond the surfaces of the circuit patterns 12, 14, 112 and 114 or of the electrically conducting layers 9 and 11, or specifically speaking, protrudes by not smaller than 0.1 mm and, preferably, by about 0.1 mm to 2 mm. Typical methods of filling the curable electrically conducting substance include a method in which the application of the curable electrically conducting substance is effected one time or plural times by a printing method, a method in which the curable electrically conducting substance is forcibly introduced from the sides of both front and back surfaces of the insulating substrates using a pair of front and back squeezes, and a method in which the curable electrically conducting substance is filled by using a roll coater or a curtain coater. The curable electrically conducting substance exhibits electrically conducting property when the electrically conducting material contained in the curable electrically conducting substance comes in contact with each other by the cure-contraction at the time of curing the binder. It is therefore desired that the through-holes 22 and 122 are filled with the curable electrically conducting substance by taking the contraction coefficient into consideration so as not to allow the surfaces of the curable electrically conducting substance after cured to become lower than the surfaces of the circuit patterns 12, 14, 112 and 114 or of the electrically conducting layers 9 and 11. The curable electrically conducting substance filled in the through-holes 22 and 122 can be cured by any known method using a hot air furnace, an infrared-ray furnace, a far infrared-ray furnace, an ultraviolet-ray curing furnace or an electron-beam curing furnace. The curable electrically conducting substance filled in the through holes 22 and 122 is usually cured immediately after it is filled, but may be cured simultaneously with the formation of the electrically conducting patterns 28, 30, 32, 128 and 130 at a subsequent step.

Concretely described below is a method of making both end surfaces 24, 26, 124 and 126 of the connection means 20 and 120 constituted by the electrically conducting substance which has been cured after filled in the through-holes 22 and 122, to be substantially flush with the circuit patterns 12, 14, 112 and 114 or the conducting layers 9 and 11 of the board bodies 4 and 104. That is, the curable electrically conducting substance is filled into the through holes 22 and 122, and is cured. Then, those portions of the cured electrically conducting substance that are protruding beyond the circuit patterns 12, 14, 112 and 114 or the electrically conducting layers 9 and 11, are ground and smoothed. The portions of the electrically conducting substance protruding beyond the circuit patterns 12, 14, 112 and 114 or the electrically conducting layers 9 and 11, can be smoothly ground by a method that is usually used for abrading the circuit boards, such as slurry abrasion, buff abrasion, scrub abrasion or belt abrasion. As required, at the time of smoothly grinding the electrically conducting substance that constitutes the connection means 20 at the step of FIG. 16-C, the circuit patterns 12 and 14 may be protected by forming an overcoat layer composed of an insulating resin (resist) on the circuit patterns 12 and 14.

The electrically conducting layers 9 and 11 of the board bodies 4 and 104 can be formed into circuit patterns 12, 14, 112 and 114 by any widely known method without any limitation. For instance, according to a widely employed method, an etching pattern is formed on the surfaces of the electrically conducting layers 9 and 11 using an etching resist, followed by etching. The etching resist employed here may be a dry film, a resist ink or the like, and is suitably selected and is used depending upon the fineness of the pattern. Furthermore, the etching resist pattern may be a positive pattern or a negative pattern depending upon the etching method. For example, an etching method as represented by the tenting process will use a positive pattern, and an etching method as represented by the solder plate stripping process or the SES process will use a negative pattern.

When the circuit patterns 12 and 14 are to be formed after the surfaces defined by both end surfaces 24 and 26 of the connection means 20 and by the electrically conducting layers 9 and 11, are smoothly ground, as shown in FIGS. 17-D and 18-E, it is recommended to employ the ED process by using an electrodeposited photoresist since it electrically forms the resist and makes it possible to obtain circuit patterns with high precision and reliability without adversely affected by dust and dirt. In particular, use of the negative electrodeposited photoresist eliminates the need of exposing the through-hole 22 and 122 to light since the through-hole 22 and 122 has been filled with the electrically conducting substance, and makes it possible to reliably form the circuit boards 2 and 102 having connection means 20 and 120 in a diameter of as small as 0.3 mm or less.

As a method of forming electrically conducting patterns 28, 30, 32, 128 and 130 having uniform thicknesses by applying a curable electrically conducting substance, there can be desirably employed a conventional method of forming electrically conducting patterns by printing. Concretely speaking, there can be exemplified a method in which the curable electrically conducting substance is applied to required portions by using a dispenser and is cured, and a method in which the curable electrically conducting substance is applied by using a screen printer and is cured. The curable electrically conducting substance can be cured by a widely known method using a hot air furnace, an infrared-ray furnace, a far infrared-ray furnace, an ultraviolet-beam curing furnace or an electron-ray curing furnace like curing the curable electrically conducting substance that is filled into the through-holes 22 and 122.

According to the present invention, the connection means 20 and 120 constituted by an electrically conducting substance filled and cured in the through-holes 22 and 122, are formed substantially in flush with the circuit patterns 12, 14, 112 and 114 or the electrically conducting layers 9 and 11. Therefore, the curable electrically conducting substance can be applied onto the connection portions by using, for example, a screen printer without causing spreading. That is, the curable electrically conducting substance is applied excellently and uniformly. The electrically conducting patterns 28, 30, 32, 128 and 130 have uniform and small thicknesses. In the conventional circuit boards in which the electrically conducting substance was filled in the through-hole in a manner to overflow onto the periphery thereof to form the connection means, a holder resist layer had to be formed twice being divided into the circuit pattern and the connection means. In the circuit boards 2 and 102 of the present invention, however, the solder resist layer can be formed in one time with good precision.

Referring to FIG. 18-E, the surfaces defined by both end surfaces 24 and 26 of the connection means 20 and by the electrically conducting layers 9 and 11 are smoothly ground, the electrically conducting patterns 28, 30 and 32 are formed and, then, the circuit patterns 12 and 14 are formed. In this case, the surfaces of the electrically conducting substance filled in the through-hole 22 are not exposed to an etching resist, an alkaline solution such as a solution for stripping the etching resist or an acidic solution for treating the surfaces. Therefore, the surfaces of the electrically conducting substance and the interfaces between the electrically conducting substance and the circuit patterns are not contaminated, making it possible to greatly improve reliability of the connection means 20.

In producing the circuit boards 2 and 102 of the present invention, the surface defined by the connection means 20 and 120, circuit patterns 12, 14, 112 and 114 or electrically conducting layers 9 and 11 can be smoothly ground and, then, the electrically conducting patterns 28, 30, 32, 128 and 130 can be formed on the surfaces on one side of the board bodies 4 and 104. Thereafter, the same steps may be executed onto the surfaces on the other side of the board bodies 4 and 104.

Described below are Examples and Comparative Examples for concretely explaining the present invention which, however, is in no way limited to these Examples only.

EXAMPLE 1

A copper paste of the following composition was used as a curable electrically conducting substance to be filled in the through-hole. That is, a copper paste was prepared by kneading a mixture of a bisphenol A diglycidyl ether having an epoxy equivalent of 173 g/equivalent as a binder component, 35 parts by weight of a decylglycidyl ether 39 parts by weight of a novolak-type phenol resin as a curing agent per 100 parts by weight of the bisphenol A diglycidyl ether, a tree twig-like copper powder having an average particle diameter of 10.5 μm as a copper powder in an amount of 360 parts by weight per 100 parts by weight of the binder, and a 2-ethyl-4-methylimidazole in an amount of 2.8 parts by weight per 100 parts by weight of the binder, using a triple roll for 45 minutes. Hereinafter, this copper paste is referred to as "copper paste A".

As a curable electrically conducting substance for forming electrically conducting patterns, furthermore, use was made of a paste NF-2000 in which the main component of the binder was a resol-type phenol resin, produced by Tatsuta Densen Co. This copper paste is hereinafter referred to as "copper paste B".

A circuit board was produced according to the steps shown in FIGS. 16-A to 16-D. That is, (A) 100 through-holes having a diameter of 0.6 mm were formed, by drilling, in an insulating substrate which was a glass-epoxy board having a thickness of 1.2 mm and having electrically conducting layers made up of a copper foil formed on both surfaces thereof, circuit patterns including wirings having a width of 50 μm at a gap of 50 μm and further including land portions were formed on both surfaces of the insulating substrate, (B) the copper paste A was filled as a curable electrically conducting substance into the through-holes by the screen-printing method so as to protrude by 0.25 mm beyond the circuit patterns, and was cured using an air oven under the conditions of 50° C. for 30 minutes and 180° C. for 60 minutes to form connection means, (C) the surfaces defined by the circuit patterns and the connection means were smoothly ground by using a buff of #200 and then a buff of #360, and (D) the copper paste B was applied as a curable electrically conducting substance by the screen-printing method to cover substantially the whole end surfaces of the connection means and inner peripheral edge portions of a width of 0.1 mm of the land portions in the circuit patterns that connect to the connection means, and was cured by using the air oven under a condition of 160° C. for 30 minutes to form electrically conducting patterns having an average thickness of 30 μm (fluctuation of about ±10%). One hundred pieces of the circuit boards were thus obtained.

The thus obtained circuit boards did not undergo short circuit or open circuit in the circuit patterns, and their yield was 100%. The electric resistance of the connection means connecting together the electrically conducting patterns formed on both surfaces of the circuit board was measured to be 15 mΩ/connection means in average. After the circuit board was subjected to high-temperature/high-humidity conditions of 60° C.–90% RH for 1000 hours, the resistance of the connection means was again measured and was found to be 17 mΩ/connection means in average. Furthermore, the surfaces of the circuit board were little uneven and on which the solder paste could be favorably printed at the time of mounting the surface-mounting parts, enabling the surface-mounting parts to be reliably connected.

EXAMPLE 2

A circuit board was produced according to the steps shown in FIGS. 17-A to 17-E. That is, (A) 100 through-holes having a diameter of 0.5 mm were formed by drilling in an insulating substrate which was a glass-epoxy board of a thickness of 1.2 mm having electrically conducting layers made up of a copper foil formed on both surfaces thereof, (B) the copper paste A was filled as a curable electrically conducting substance into the through-holes by the screen-printing method, and was cured using an air oven under the conditions of 50° C. for 30 minutes and 180° C. for 60 minutes to form connection means, (C) the surfaces defined by the electrically conducting layers and the connection means were smoothly ground by using a buff of #200 and then a buff of #360, (D) circuit patterns including wirings having a width of 50 μm at a gap of 50 μm and further including land portions were formed in the electrically conducting layers by using an etching resist on both surfaces, and (E) the copper paste B was applied as a curable electrically conducting substance by the screen-printing method to cover substantially the whole end surfaces of the connection means and inner peripheral edge portions of a width of 0.1 mm of the land portions in the circuit patterns that connect to the connection means, and was cured by using the air oven under a condition of 160° C. for 30 minutes to form electrically conducting patterns having an average thickness of 25 μm (fluctuation of about ±10%). One hundred pieces of the circuit boards were thus obtained.

The thus obtained circuit boards did not undergo short circuit or open circuit in the circuit patterns, and their yield was 100%. The electric resistance of the connection means connecting together the electrically conducting patterns formed on both surfaces of the circuit board was measured to be 19 mΩ/connection means in average. After the circuit board was subjected to high-temperature/high-humidity conditions of 60° C.–90% RH for 1000 hours, the resistance of the connection means was again measured and was found to be 22 mΩ/connection means in average. Furthermore, the surfaces of the circuit board were little uneven and on which the solder paste could be favorably printed at the time of mounting the surface-mounting parts, enabling the surface-mounting parts to be reliably connected.

EXAMPLE 3

A circuit board was produced according to the steps shown in FIGS. 18-A to 18-E. That is, (A) 100 through-holes having a diameter of 0.5 mm were formed by drilling in an insulating substrate which was a glass-epoxy board having a thickness of 1.2 mm and having electrically conducting layers made up of a copper foil formed on both surfaces thereof, (B) the copper paste A was filled as a curable electrically conducting substance into the through-holes by the screen-printing method, and was cured using an air oven under the conditions of 50° C. for 30 minutes and 180° C. for 60 minutes to form connection means, (C) the surfaces defined by the electrically conducting layers and the connection means were smoothly ground by using a buff of #200 and then a buff of #360, (D) the copper paste B was applied as a curable electrically conducting substance by the screen-printing method to cover substantially the whole end surfaces of the connection means and inner peripheral edge portions of a width of 0.1 mm of the electrically conducting layers that connect to the connection means, and was cured by using the air oven under a condition of 160° C. for 30 minutes to form electrically conducting patterns having an average thickness of 25 µm (fluctuation of about ±10%), and (E) circuit patterns including wirings having a width of 50 µm at a gap of 50 µm and further including land portions were formed in the electrically conducting layers by using an etching resist on both surfaces. One hundred pieces of the circuit boards were thus obtained.

The thus obtained circuit boards did not undergo short circuit or open circuit in the circuit patterns, and their yield was 100%. The electric resistance of the connection means connecting together the electrically conducting patterns formed on both surfaces of the circuit board was measured to be 18 mΩ/connection means in average. After the circuit board was subjected to high-temperature/high-humidity conditions of 60° C.–90% RH for 1000 hours, the resistance of the connection means was again measured and was found to be 19 mΩ/connection means in average. Furthermore, the surfaces of the circuit board were little uneven and on which the solder paste could be favorably printed at the time of mounting the surface-mounting parts, enabling the surface-mounting parts to be reliably connected.

EXAMPLE 4

A circuit board was produced according to the steps shown in FIGS. 17-A to 17-E and, finally, nickel and gold were plated thereon. That is, (A) 100 through-holes having a diameter of 0.5 mm were formed by drilling in an insulating substrate which was a glass epoxy board of a thickness of 1.2 mm having electrically conducting layers made up of a copper foil formed on both surfaces thereof, (B) the copper paste A was filled as a curable electrically conducting substance into the through-holes by the screen-printing method, and was cured using an air oven under the conditions of 50° C. for 30 minutes and 180° C. for 60 minutes to form connection means, (C) the surfaces defined by the electrically conducting layers and the connection means were smoothly ground by using a buff of #200 and then a buff of #360, (D) circuit patterns including wirings having a width of 50 µm at a gap of 50 µm, land portions and pad portions were formed in the electrically conducting layers by using an etching resist on both surfaces, (E) the copper paste B was applied as a curable electrically conducting substance by the screen-printing method to cover substantially the whole end surfaces of the connection means, inner peripheral edge portions of a width of 0.1 mm of the land portions in the circuit patterns that connect to the connection means, and to cover pad portions on which the surface-mounting parts will be mounted, and was cured by using the air oven under a condition of 160° C. for 30 minutes to form electrically conducting patterns having an average thickness of 25 µm (fluctuation of about ±10%), and (F) nickel-plating having a thickness of 4 µm and gold-plating having a thickness of 0.2 µm were effected on the circuit patterns and on the electrically conducting patterns. One hundred pieces of the circuit boards were thus obtained.

The thus obtained circuit boards did not undergo short circuit or open circuit in the circuit patterns, and their yield was 100%. The electric resistance of the connection means connecting together the electrically conducting patterns formed on both surfaces of the circuit board was measured to be 19 mΩ/connection means in average. After the circuit board was subjected to high-temperature/high-humidity conditions of 60° C.–90% RH for 1000 hours, the resistance of the connection means was again measured and was found to be 20 mΩ/connection means in average. Furthermore, the surfaces of the circuit board were little uneven and on which the solder paste could be favorably printed at the time of mounting the surface-mounting parts, enabling the surface-mounting parts to be reliably connected.

EXAMPLE 5

By using a board body consisting of three laminated insulating substrates, a circuit board was produced according to the steps shown in FIGS. 17-A to 17-E and, finally, nickel-gold plating was effected thereon. That is, (A) 100 through-holes having a diameter of 0.5 mm were formed by drilling in the board body consisting of three laminated insulating substrates each being a glass-epoxy board with a thickness of 1.2 mm and having circuit patterns made up of a copper foil formed between the insulating substrates and further having electrically conducting layers made up of a copper foil formed on both surfaces of the board body, (B) the copper paste A was filled as a curable electrically conducting substance into the through-holes by the screen-printing method, and was cured using an air oven under the conditions of 50° C. for 30 minutes and 180° C. for 60 minutes to form connection means, (C) the surfaces defined by the electrically conducting layers and the connection means were smoothly ground by using a buff of #200 and then a buff of #360, (D) circuit patterns including wirings having a width of 50 µm at a gap of 50 µm, and portions and pad portions were formed in the electrically conducting layers by using an etching resist on both surfaces, (E) the copper paste B was applied as a curable electrically conducting substance by the screen-printing method to cover substantially the whole end surfaces of the connection means, inner peripheral edge portions of a width of 0.1 mm of the land portions in the circuit patterns that connect to the connection means, and to cover pad portions on which the surface-mounting parts will be mounted, and was cured by using the air oven under a condition of 160° C. for 30 minutes to form electrically conducting patterns having an average thickness of 25 µm (fluctuation of about ±10%), and (F) nickel-plating having a thickness of 4 µm and gold-plating having a thickness of 0.2 µm were effected on the circuit patterns of both surfaces and on the electrically conducting patterns. One hundred pieces of the circuit boards were thus obtained.

The thus obtained circuit boards did not undergo short-circuiting or breakage in the circuit patterns, and their yield was 100%. The electric resistance of the connection means connecting together the electrically conducting patterns formed on both surfaces of the circuit board was measured to be 19 mΩ/connection means in average. The electric resistance of the connection means connecting together the circuit patterns formed between the insulating substrates was measured to be 22 mΩ/connection means. After the circuit board was subjected to high-temperature/high-humidity conditions of 60° C.–90% RH for 1000 hours, the resistance of the connection means connecting together the electrically conducting patterns formed on both surfaces of the circuit board was again measured and was found to be 20 mΩ/connection means in average, and the resistance of the connection means connecting together the circuit patterns formed between the insulating substrates was measured to be 22 mΩ/connection. Furthermore, the surfaces of the circuit board were little uneven and on which the solder paste could be favorably printed at the time of mounting the surface-mounting parts, enabling the surface-mounting parts to be reliably connected.

Comparative Example 1

A circuit board was produced according to the steps (A) and (B) of Example 1. In order to mount the parts on the circuit board, a solder paste was applied onto the circuit board by the screen-printing method. However, the solder paste was not almost printed onto the circuit board and the parts could not be mounted. The electric resistance of the connection means connecting both surfaces of the circuit board was measured to be 17 mΩ/connection means in average. After the circuit board was subjected to high-temperature/high-humidity conditions of 60° C.–90% RH for 1000 hours, the resistance of the connection means was again measured to be 98 mΩ/connection means, which was a conspicuous increase in the resistance.

Comparative Example 2

A connection means was formed according to the steps (A) to (C) of Example 3, a common plating layer was formed on the connection means and on the electrically conducting layers, and circuit patterns including wirings having a width of 50 μm at a gap of 50 μm were formed in the plating layer and in the electrically conducting layer by using an etching resist on both surfaces. One hundred pieces of the circuit boards were thus obtained. The obtained circuit boards had short-circuiting and breakage in the circuit patterns, and their yield was 27%.

What we claim is:

1. A circuit board comprising:
   a board body including at least one insulating substrate, said board body having a through-hole formed therethrough,
   circuit patterns formed on both surfaces of said board body,
   connection means disposed in said through-hole for electrically connecting together said circuit patterns formed on said surfaces of said board body, said connection means is constituted by an electrically conducting substance filling said through-hole formed in said board body, at least one end surface of said electrically conducting substance being substantially flush with one of said circuit patterns, wherein said electrically conducting substance is a paste obtained by mixing an electrically conducting powder and an epoxy resin, said electrically conducting substance is cured after having been filled in said through-hole, and
   an electrically conducting pattern provided in contact with said connection means, said electrically conducting pattern has a substantially uniform thickness formed to substantially cover said connection means and a connection edge portion of one of said circuit patterns, said electrically conducting pattern being composed of a cured paste obtained by mixing an electrically conducting powder and a phenol resin, said cured paste is electrically conducting and is highly moistureproof; and
   wherein the connection edge portion is connected to said one end surface of said connection means.

2. A circuit board according to claim 1, wherein said through-hole formed in said board body has a circular shape in cross section with a diameter of from 0.1 to 2 mm.

3. A circuit board according to claim 1, wherein said electrically conducting powder comprises at least any one of gold, silver, copper, nickel, lead and carbon.

4. A circuit board according to claim 1, wherein said connection means exhibits an electric resistance of not larger than $1 \times 10^{-2}$ Ω.cm after being cured.

5. A circuit board according to claim 1, wherein said electrically conducting pattern is subject to soldering or nickel-gold plating after being cured.

6. A circuit board according to claim 1, wherein said connection edge portion of said circuit pattern has a width of not smaller than 0.05 mm.

7. A circuit board according to claim 1, wherein said circuit pattern has a land portion surrounding said one end surface of said connection means, and said electrically conducting pattern covers said land portion of said circuit pattern.

8. A circuit board according to claim 1, wherein said electrically conducting pattern has a tear-drop shape.

9. A circuit board according to claim 1, wherein said circuit pattern has a land portion surrounding said one end surface of said connection means, and said electrically conducting pattern has a shape of a doughnut covering said one end surface of said connection means and said land portion of said circuit pattern.

10. A circuit board according to claim 1, wherein said electrically conducting pattern has a thickness of from 5 to 100 μm.

11. A circuit board comprising:
    a board body including a plurality of laminated insulating substrates, said board body having a through-hole formed therethrough,
    a surface-layer circuit pattern formed on at least one surface of said board body,
    an inner-layer circuit pattern formed between said insulating substrates,
    a connection means disposed in said through-hole for electrically connecting together said surface-layer circuit pattern and said inner-layer circuit pattern, said connection means is constituted by an electrically conducting substance filling said through-hole formed in said board body, one end surface of said electrically conducting substance being substantially flush with said surface-layer circuit pattern formed on one surface of said board body, wherein said electrically conducting substance is a paste obtained by mixing an electrically conducting powder and an epoxy resin, said electrically conducting substance is cured after having been filled in said through-hole, and
    an electrically conducting pattern provided in contact with said connections means, said electrically conducting pattern has a substantially uniform thickness formed to substantially cover said connection means and a connection edge portion of said surface-layer circuit pattern, said electrically conducting pattern being composed of a cured paste obtained by mixing an electrically conducting powder and a phenol resin, said cured paste is electrically conducting and is highly moistureproof; and wherein the connection edge portion is connected to said one end surface of said connection means.

12. A circuit board according to claim 11, wherein said through-hole formed in said board body has a circular shape in cross section with a diameter of from 0.1 to 2 mm.

13. A circuit board according to claim 11, wherein said electrically conducting powder comprises at least any one of gold, silver, copper, nickel, lead and carbon.

14. A circuit board according to claim 11, wherein said connection means exhibits an electric resistance of not larger than $1\times10^2$ $\Omega$.cm after being cured.

15. A circuit board according to claim 11, wherein said electrically conducting pattern is subjected to soldering or nickel-gold plating after being cured.

16. A circuit board according to claim 11, wherein said connection edge portion of said circuit pattern has a width of not smaller than 0.05 mm.

17. A circuit board according to claim 11, wherein said circuit pattern has a land portion surrounding said one end surface of said connection means, and said electrically conducting pattern covers said land portion of said circuit pattern.

18. A circuit board according to claim 11, wherein said electrically conducting pattern has a tear-drop shape.

19. A circuit board according to claim 11, wherein said circuit pattern has a land portion surrounding said one end surface of said connection means, and said electrically conducting pattern has a shape of a doughnut covering said one end surface of said connection means and said land portion of said circuit pattern.

20. A circuit board according to claim 11, wherein said electrically conducting pattern has a thickness of from 5 to 100 µm.

* * * * *